Nov. 15, 1960 R. B. JACKSON 2,960,665
TRANSISTOR OSCILLATOR CIRCUITS
Filed Aug. 3, 1953
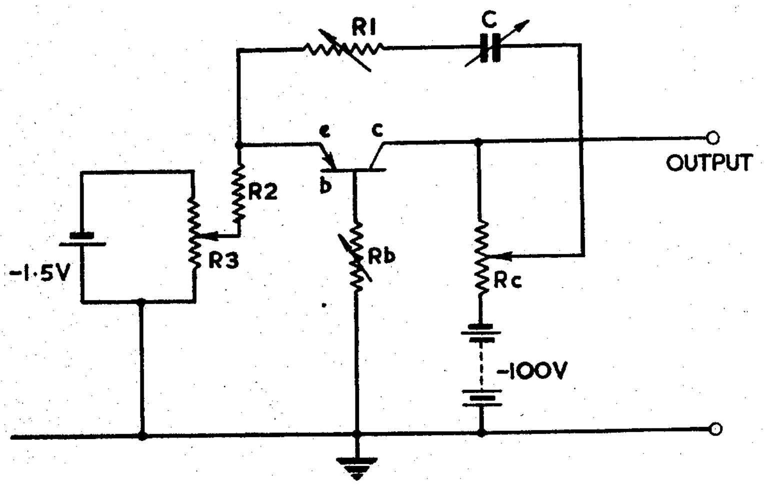
Robert Blake Jackson
Inventor
By Cushman, Darby & Cushman
Attorneys United States Patent Office 2,960,665 Patented Nov. 15, 1960

2,960,665

TRANSISTOR OSCILLATOR CIRCUITS

Robert Blake Jackson, Aldershot, England, assignor to National Research Development Corporation, London, England, a British corporation Filed Aug. 3, 1953, Ser. No. 372,133

Claims priority, application Great Britain Aug. 21, 1952

11 Claims. (Cl. 331—108)

The present invention relates to transistor oscillator circuits.

Transistor oscillator circuits for producing sinusoidal outputs normally include a positive feedback circuit having an inductance-capacity filter network incorporated therein.

It is an object of the present invention to provide a resistance-capacity coupled transistor oscillator circuit which is capable of giving a substantially sinusoidal output.

It is a further object of the present invention to provide a transistor oscillator circuit which is capable of giving such an output over a wide band of frequencies.

According to the present invention, an oscillator circuit comprises a transistor, a resistive load connected into the collector electrode circuit of the transistor, a feedback circuit including a condenser and a resistor connected between the collector electrode circuit and the emitter electrode circuit of the transistor and a resistor connected in series with the base electrode of the transistor, the resistance of the resistor connected in series with the base electrode being so chosen in conjunction with the other parameters of the oscillator circuit that a substantially sinusoidal output is obtainable from the oscillator circuit.

In order that the invention may be more clearly understood, an embodiment of the invention will now be described, by way of example, with reference to the accompanying drawing which is a circuit diagram of a transistor oscillator.

The drawing shows a transistor having a base electrode *b*, an emitter electrode *e* and a collector electrode *c*. A collector load comprises a variable potentiometer R*c* series-connected between the collector electrode *c* and a battery having a voltage of minus 100 volts with respect to earth. The variable tapping of the potentiometer R*c* is connected through a condenser C and a variable resistor R1 to the emitter electrode *e* thereby providing a feedback path from the collector circuit to the emitter circuit. The emitter electrode *e* is biassed negatively with rsepect to earth by means of another battery, a resistor R2 and a variable potentiometer R3. The base electrode is connected to earth through a variable resistor R*b* which provides positive feedback from the collector to the emitter circuit.

The feedback path through the condenser C and the resistor R1 provides positive feedback from the collector circuit to the emitter circuit. The resistance of the variable resistor R1 and the capacity of the condenser C affect the frequency of oscillation of the oscillator. The setting of the variable resistor R1 has some effect on the shape of the waveform of the oscillator output.

Variation of the capacity of the condenser C has been found to provide a suitable form of frequency control of the oscillator and by using a variable condenser the frequency of oscillation of the oscillator may be made to vary smoothly over a wide band of frequencies.

An oscillator constructed in the hereinbefore described manner was made to oscillate at frequencies lying within the range 500 c./s. to 170 kc./s., the values of the condenser C being of the order of 0.1 $\mu$f. for a frequency of 500 c./s. and 0.002 $\mu$f. for a frequency of 20 kc./s.

The additional positive feedback provided by the resistor R*b* in the base electrode circuit of the oscillator serves to maintain the oscillations of the oscillator over a wide band of frequencies when, because of the necessary variations in the capacity of the condenser C, the positive feedback through the feedback path C, R1 varies considerably. The resistor R*b* should not be of so great a value that the oscillator ceases to oscillate sinusoidally or of so small a value that oscillations are not maintained. The resistor R*b* also provides a direct voltage bias between the base electrode and the emitter electrode and must, therefore, be adjusted in conjunction with the potentiometer R3. The current gain of the transistor used in the circuit should preferably be at least 2.

Convenient values for the components used in the circuit were found to be as follows:

| | |
|---|---|
| R*c* | 25,000 ohms potentiometer. |
| R*b* | 2,500 ohms variable resistance. |
| R1 | 2,500 ohms variable resistance. |
| R2 | 470 ohms. |
| R3 | 5,000 ohms potentiometer. |

The transistor used was a point-type similar to that sold by the General Electric Company under the trade designation G–11.

Adjustment of the circuit to provide the least distorted sine waveform may be made by adjusting the variable resistors R1 and R*b*. A suitable setting for the variable resistance R1 has been found to be of the order of 200 to 300 ohms and that for the variable resistor R*b* of the order of 300 to 500 ohms. The amplitude of the output from the oscillator is regulated by adjusting the amount of feedback by means of the potentiometer R*c*.

The emitter bias is adjusted by means of the potentiometer R3 and with the transistor used was found to be optimum at −1 volt with respect to earth. However, a positive bias with respect to earth may be used.

In a slightly modified construction of the oscillator, the appropriate emitter bias is provided mainly by the resistor R*b* in the base electrode circuit, the variable potentiometer R3 and its associated battery being omitted from the circuit. The resistor R2 is connected between the emitter electrode and earth and is increased in resistance to a value of the order of 2,000 ohms. The variable resistor R*b* may conveniently be arranged to vary from 0 to 2,000 ohms. In an oscillator constructed in this manner a suitable resistance of the resistor R*b* was found to be 800±10 ohms.

I claim:

1. An oscillator circuit comprising a point-type transistor having emitter, collector and base electrodes, a voltage source, a resistive load connected between the collector electrode of the transistor and said voltage source, a feedback circuit including a condenser and a resistor connected between the collector electrode and the emitter electrode of the transistor and means including a resistor connected in series with the base electrode of the transistor for intercoupling the base electrode, said voltage source and the emitter electrode, the resistance of the resistor connected in series with the base electrode being so chosen in conjunction with the other parameters of the oscillator circuit that a substantially sinusoidal output is obtainable from the oscillator circuit.

2. An oscillator circuit comprising a point-type transistor, two terminals for connecting the oscillator circuit to a voltage source, a potentiometer connected between one of the terminals and the collector electrode of the transistor, a resistor and a condenser connected in series between a tapping on the potentiometer and the emitter electrode of the transistor, a resistor connected between the other of the terminals and the emitter electrode of the transistor and a resistor connected between the said other of the terminals and the base electrode of the transistor, the resistance of the resistor connected between the said other of the terminals and the base electrode being so chosen in conjunction with the other parameters of the oscillator circuit that a substantially sinusoidal output is obtainable from the oscillator circuit.

3. An oscillator circuit as claimed in claim 1 and wherein the condenser is variable.

4. An oscillator circuit as claimed in claim 1 and wherein the intercoupling means includes means in the emitter circuit of the transistor for adjusting the emitter bias.

5. An oscillator circuit as claimed in claim 2 wherein the condenser is variable.

6. An oscillator circuit as claimed in claim 2 wherein means are provided in the emitter circuit of the transistor for adjusting the emitter bias.

7. An oscillator circuit as claimed in claim 3 wherein means are provided in the emitter circuit of the transistor for adjusting the emitter bias.

8. An oscillator circuit comprising a point-type transistor, a potentiometer one end of which is connected to the collector electrode of the transistor and the other end of which is connected to a potential source, a condenser and a resistor connected in series between a tapping on the potentiometer and the emiter electrode of the transistor, means connecting the emitter electrode to a potential source and a resistor connecting the base electrode of the transistor to a potential source, the value of the resistor connected in series with the base electrode being so chosen in conjunction with the other parameters of the oscillator circuit that a substantially sinusoidal output is obtainable from the oscillator circuit.

9. An oscillator circuit as claimed in claim 8 and wherein the condenser is variable.

10. An oscillator circuit as claimed in claim 1 wherein the transistor has a current gain greater than unity.

11. An oscillator circuit as claimed in claim 10 wherein the transistor has a current gain of at least 2.

References Cited in the file of this patent

UNITED STATES PATENTS

| | | |
|---|---|---|
| 2,660,624 | Bergson | Nov. 24, 1953 |
| 2,663,800 | Herzog | Dec. 22, 1953 |
| 2,675,474 | Eberhard | Apr. 13, 1954 |
| 2,679,594 | Fromm | May 25, 1954 |
| 2,692,337 | Hanson | Oct. 19, 1954 |
| 2,745,960 | Griffith | May 15, 1956 |

FOREIGN PATENTS

| | | |
|---|---|---|
| 114,183 | Australia | Nov. 4, 1941 |

OTHER REFERENCES

Article—Phase Shift Oscillators—by Ginzton et al.; pages 43–49 of IRE, vol. 29, No. 2, February 1941.